(12) United States Patent
Joubert et al.

(10) Patent No.: US 11,049,760 B2
(45) Date of Patent: Jun. 29, 2021

(54) UNIVERSAL PROCESS KIT (71) Applicant: Applied Materials, Inc., Santa Clara, CA (US)

(72) Inventors: Olivier Joubert, Meylan (FR); Jason A. Kenney, Sunnyvale, CA (US); Sunil Srinivasan, Milpitas, CA (US); James Rogers, Los Gatos, CA (US); Rajinder Dhindsa, Pleasanton, CA (US); Vedapuram S. Achutharaman, Saratoga, CA (US); Olivier Luere, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 399 days.

(21) Appl. No.: 15/436,936

(22) Filed: Feb. 20, 2017

(65) Prior Publication Data
US 2017/0256435 A1    Sep. 7, 2017

Related U.S. Application Data (60) Provisional application No. 62/303,849, filed on Mar. 4, 2016.

(51) Int. Cl.
*H01L 21/687* (2006.01)
*H01J 37/32* (2006.01)
*H01L 21/683* (2006.01)

(52) U.S. Cl.
CPC .. *H01L 21/68735* (2013.01); *H01J 37/32623* (2013.01); *H01J 37/32642* (2013.01);
(Continued)

(58) Field of Classification Search
CPC ............ H01L 21/68735; H01L 21/6833; H01J 37/32623; H01J 37/32642
(Continued)

(56) References Cited

U.S. PATENT DOCUMENTS 6,284,093 B1   9/2001  Ke et al.
6,554,954 B2   4/2003  Ma et al.
(Continued)

FOREIGN PATENT DOCUMENTS

JP   2010-251723 A   11/2010
TW   D153356         5/2013
(Continued)

OTHER PUBLICATIONS

Office Action for Taiwan Application No. 106106802 dated Jun. 19, 2019.
(Continued)

*Primary Examiner* — Charlee J. C. Bennett
(74) *Attorney, Agent, or Firm* — Patterson + Sheridan, LLP (57) ABSTRACT The implementations described herein generally relate to a process kit suitable for use in a semiconductor process chamber, which reduces edge effects and widens the processing window with a single edge ring as compared to conventional process kits. The process kit generally includes an edge ring disposed adjacent to and surrounding a perimeter of a semiconductor substrate in a plasma chamber. A dimension of a gap between the substrate and the edge ring is less than about 1000 μm, and a height difference between the substrate and the edge ring is less than about (+/−) 300 μm. The resistivity of the ring is less than about 50 Ohm-cm.

20 Claims, 6 Drawing Sheets (52) U.S. Cl.
CPC .... *H01J 37/32715* (2013.01); *H01L 21/6833* (2013.01); *H01J 37/32082* (2013.01); *H01J 2237/334* (2013.01); *H01J 2237/3321* (2013.01)

(58) Field of Classification Search
USPC .......................................... 156/345.1–345.55
See application file for complete search history.

(56) References Cited

U.S. PATENT DOCUMENTS

| | | | |
|---|---|---|---|
| 6,689,249 | B2 | 2/2004 | Ke et al. |
| 7,338,578 | B2 | 3/2008 | Huang et al. |
| D665,491 | S | 8/2012 | Goel et al. |
| 8,287,650 | B2 | 10/2012 | Lee et al. |
| 8,740,206 | B2 | 6/2014 | Arun et al. |
| 8,771,423 | B2 | 7/2014 | Lee et al. |
| 8,988,848 | B2 | 3/2015 | Todorow et al. |
| D766,849 | S | 9/2016 | Fukushima et al. |
| D793,976 | S | 8/2017 | Fukushima et al. |
| D797,691 | S * | 9/2017 | Joubert ........................ D13/182 |
| 2001/0015262 | A1* | 8/2001 | Denpoh ............ H01J 37/32642 156/345.37 |
| 2003/0106646 | A1 | 6/2003 | Ma et al. |
| 2005/0061447 | A1* | 3/2005 | Kim .................. H01J 37/32623 156/345.51 |
| 2006/0283553 | A1 | 12/2006 | Ma et al. |
| 2007/0258075 | A1 | 11/2007 | Kim et al. |
| 2008/0239691 | A1* | 10/2008 | Miyagawa ........ H01L 21/67005 361/809 |
| 2009/0221150 | A1 | 9/2009 | Hammond, IV et al. |
| 2010/0002355 | A1* | 1/2010 | Morooka .......... H01L 21/67069 361/234 |
| 2010/0040768 | A1* | 2/2010 | Dhindsa ............ H01J 37/32642 427/8 |
| 2010/0243606 | A1 | 9/2010 | Koshimizu et al. |
| 2010/0300622 | A1* | 12/2010 | Yatsuda ............ H01J 37/32642 156/345.44 |
| 2011/0104884 | A1* | 5/2011 | Koshiishi .......... H01J 37/32623 438/597 |
| 2011/0157760 | A1* | 6/2011 | Willwerth ........... H01L 21/6833 361/234 |
| 2013/0154175 | A1 | 6/2013 | Todorow et al. |
| 2013/0288483 | A1 | 10/2013 | Sadjadi et al. |
| 2014/0034239 | A1 | 2/2014 | Yang et al. |
| 2014/0069584 | A1 | 3/2014 | Yang et al. |
| 2014/0238604 | A1 | 8/2014 | Arun et al. |
| 2015/0001180 | A1 | 1/2015 | Doan et al. |
| 2018/0182647 | A1* | 6/2018 | Noh ..................... C23C 16/4585 |

FOREIGN PATENT DOCUMENTS

| | | |
|---|---|---|
| TW | D167109 | 4/2015 |
| TW | D167110 | 4/2015 |

OTHER PUBLICATIONS

Search Report for Taiwan Application No. 106106802 dated Jun. 18, 2019.
Office Action for Chinese Application No. 201710124363.X dated Aug. 26, 2019.
Office Action for Taiwan Application No. 106106802 dated Apr. 13, 2020.
Office Action for Chinese Application No. 201710124363.X dated Jun. 1, 2020.
Office Action for Japanese Application No. 2017-023919 dated Mar. 16, 2021.
Office Action for Taiwan Application No. 106106802 dated Feb. 4, 2021.
Search Report for Taiwan Application No. 106106802 dated Oct. 28, 2020.

* cited by examiner

FIG. 4A under the page.

UNIVERSAL PROCESS KIT

CROSS-REFERENCE TO RELATED APPLICATIONS

This application claims benefit of United States Provisional Patent Application Ser. No. 62/303,849, filed Mar. 4, 2016, which is incorporated herein by reference in its entirety.

BACKGROUND

Field

Implementations of the present disclosure generally relate to semiconductor processing and more specifically to a process kit for use in a semiconductor process chamber.

Description of the Related Art

Various semiconductor fabrication processes, such as plasma assisted etching or chemical vapor deposition, are performed in plasma process chambers. A substrate support supports a substrate at a processing position within the semiconductor process chamber. A plasma region comprising one or more processing gases is maintained within the semiconductor process chamber to perform a semiconductor fabrication process on the substrate disposed on the substrate support.

A plasma sheath is a thin region of strong electric fields formed by a space charge that separates the plasma to a material boundary. During plasma etching, the plasma sheath is formed between the plasma and substrate being etched, the walls of the semiconductor process chamber, and all other parts of the semiconductor process chamber in contact with the plasma region, including the process kit.

The thickness of the plasma sheath (d) is represented by equation 1, shown below:

$$d=(2/3)(\varepsilon/i)^{1/2}(2e/m)^{1/4}(V_P-V_{DC})^{3/4} \qquad \text{(Equation 1)}$$

In Equation 1, "i" is the ion current density, "ε" is the permissivity of vacuum, "e" is the elementary electric charge, "m" is the ion mass, and "$V_P$" is the plasma potential. As shown, the thickness of the plasma sheath can be increased or decreased by adjusting the plasma parameters, namely the source and bias powers, which impact the ion current "i" and "$V_{DC}$" respectively. The ions produced in a plasma region are accelerated in the plasma sheath in a trajectory perpendicular to the plasma sheath. As the plasma sheath generally is parallel to the flat surface of the substrate, ions passing through the plasma sheath generally impact the substrate in a perpendicular direction. Conversely, perturbations of the shape of the plasma sheath, for example caused by the presence of the process kit at the edge of the substrate modifies the ion flux locally, causing the ions passing through the plasma sheath to impact the substrate in a non-perpendicular direction, thus creating etch non-uniformities.

Therefore, there is a need in the art for an improved process kit.

SUMMARY

A process kit suitable for use in a semiconductor process chamber is disclosed. In one implementation, the process kit includes an edge ring. The edge ring includes an inner ring and an outer ring. The inner ring includes a non-metallic, conductive body having a first surface opposite a second surface. The non-metallic, conductive body has a resistivity of less than about 50 Ohm-cm. The inner ring further includes a notch disposed along an inner diameter of the inner ring. The notch has a vertical component that rises less than about 1200 μm and a horizontal component that extends between about 1300 μm and about 2500 μm. The outer ring is coupled to the inner ring and encircles a perimeter of the inner ring. The outer ring includes a quartz body having a third surface opposite a fourth surface.

In another implementation, a plasma chamber for performing a semiconductor process on a substrate is disclosed. The plasma chamber includes a substrate support assembly and a process kit. The process kit is suitable for use adjacent the substrate support assembly and is coupled to a flange of the substrate support assembly. The process kit includes an edge ring and a conductive member. The edge ring comprises a notch disposed along an inner diameter of the edge ring. The notch has a vertical component that rises less than about 1200 μm and a horizontal component that extends between about 1300 μm and about 2500 μm. Furthermore, the conductive member is coupled to the edge ring.

In yet another implementation, a process kit suitable for use in a process chamber includes an edge ring, at least one thermal contact pad, and a conductive member. The edge ring encircles a perimeter of a substrate support assembly disposed in the process chamber. The edge ring includes an inner ring and an outer ring. The inner ring is disposed adjacent the substrate support assembly and includes a non-metallic, conductive material. The inner ring further includes a notch disposed along an inner diameter of the inner ring, wherein the notch has a vertical component that rises less than about 1200 μm and a horizontal component that extends between about 1300 μm and about 2500 μm. The outer ring is coupled to the inner ring and encircles a perimeter of the inner ring. The outer ring includes a quartz material. The at least one thermal contact pad is coupled to the inner ring and disposed within a slot formed in the inner ring. Furthermore, the conductive member is coupled to the outer ring.

BRIEF DESCRIPTION OF THE DRAWINGS

So that the manner in which the above-recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The implementations described herein generally relate to a process kit suitable for use in a semiconductor process chamber, which reduces edge effects with a single edge ring as compared to conventional process kits. The process kit generally includes an edge ring disposed adjacent to and surrounding a perimeter of a semiconductor substrate in a plasma chamber. A dimension of a gap between the substrate and the edge ring is less than about 1000 µm, and a height difference between the substrate and the edge ring is less than about (+/−) 300 µm. The resistivity of the ring is less than about 50 Ohm-cm.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The term "substrate" may further include the term "wafer." The substrate itself is not limited to any particular size or shape. Although the implementations described herein are made with generally made with reference to a round substrate, other shapes, such as polygonal, squared, rectangular, curved, or otherwise non-circular workpieces may be utilized according to the implementations described herein.

General Description of a Process Chamber

Figure 1:
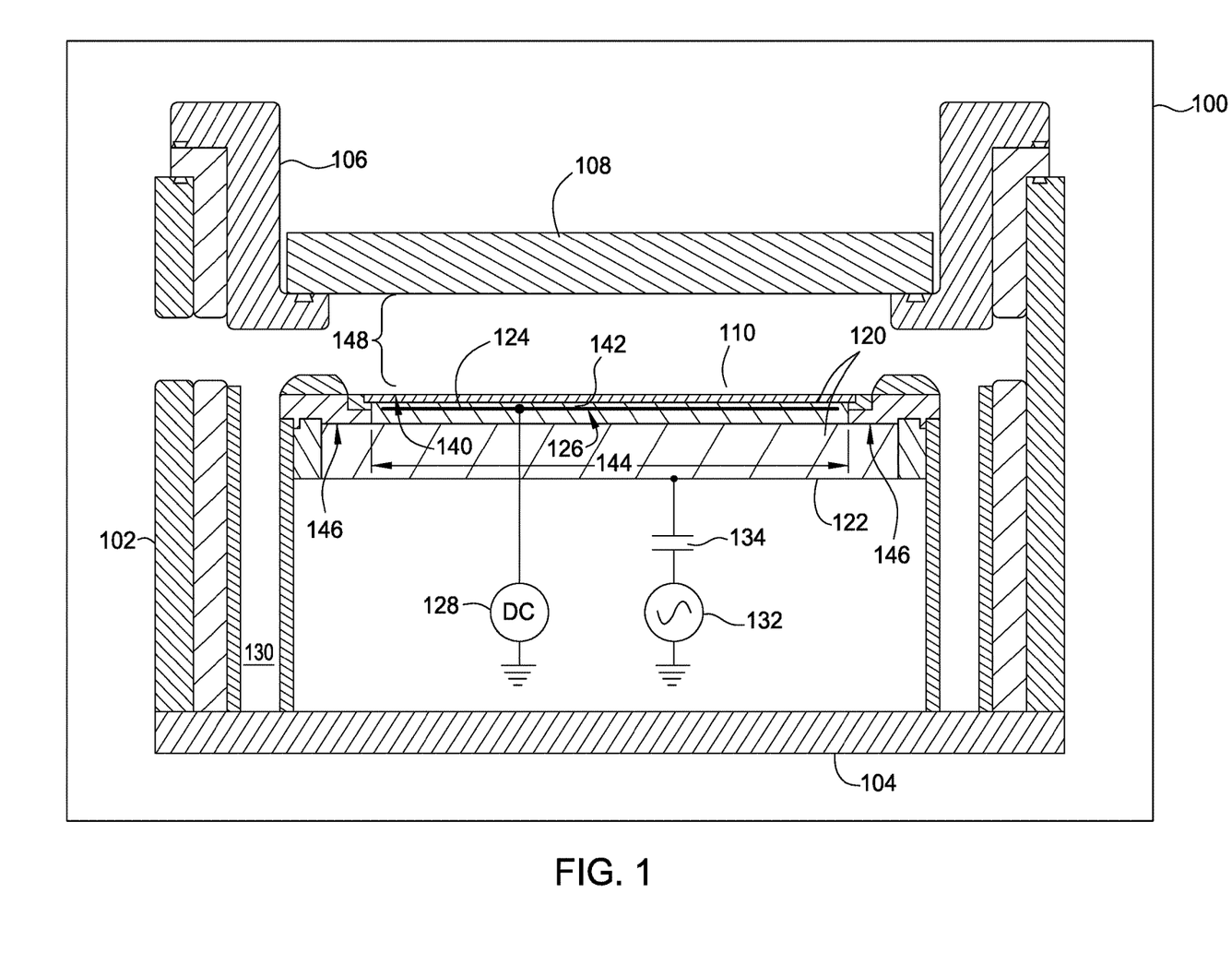
FIG. 1 illustrates a schematic cross-sectional view of a plasma-processing chamber, according to implementations described herein.

FIG. 1 illustrates a schematic cross-sectional view of one implementation of a semiconductor process chamber 100 in which the present implementation can be used. The illustrated semiconductor process chamber 100 is a magnetically enhanced plasma chamber suitable for either etching or chemical vapor deposition (CVD).

The semiconductor process chamber 100 includes a cylindrical sidewall 102, a circular bottom wall 104, and a circular top wall 106. An anode electrode 108 is mounted at the bottom of the top wall 106 and may be electrically grounded. The anode electrode 108 may be perforated to function as a gas inlet through which process gases enter the semiconductor process chamber 100. Each of the walls 102, 104, 106 of the semiconductor process chamber 100 are metal, although some or all of the walls 102, 104, 106 may include semiconductor or dielectric materials. Any walls 102, 104, 106 that are not dielectric may be electrically grounded and function as part of the anode electrode 108.

A substrate support assembly 120 is disposed in the semiconductor process chamber 100. The substrate support assembly 120 has a substantially flat front surface 140 facing the anode electrode 108. The front surface 140 of the substrate support assembly 120 supports a substrate 110 during processing. The substrate support assembly 120 may be supported by the bottom wall 104 of the semiconductor process chamber 100. The substrate support assembly 120 has the metal substrate support body 122 that functions as a cathode electrode as described infra, but the substrate support body 122 need not be metal if another electrode disposed within the substrate support assembly 120 is configured to operate as the cathode electrode.

The substrate 110 may be held in place on the substrate support assembly 120 by a mechanical clamp, vacuum, gravity, or via electrostatic force. In one implementation, the substrate support assembly 120 includes an electrostatic chuck 126, which may be energized to securely hold the substrate 110 against the front surface 140 of the substrate support assembly 120 during processing.

The electrostatic chuck 126 includes at least one chuck electrode 124 surrounded by a dielectric material 142. The dielectric material 142 of the electrostatic chuck 126 electrically insulates the chuck electrode 124 from the substrate 110 and from the metal substrate support body 122, thus enabling an electrostatic attraction to the substrate 110 to be generated upon energization of the chuck electrode 124. Power for operating the electrostatic chuck 126 is supplied by a power supply 128.

The diameter of a portion 144 of the electrostatic chuck 126 supporting the substrate 110 may be smaller than the diameter of the substrate 110 (i.e., the substrate 110 slightly overhangs the perimeter of the portion 144 of the electrostatic chuck 126 supporting the substrate 110).

The substrate support assembly 120 further includes the substrate support body 122 disposed below the electrostatic chuck 126. The substrate support body 122 may be cylindrical in shape and may be composed of a metal material, such as anodized aluminum. The substrate support body 122 has a greater radius than the electrostatic chuck 126 to provide a flange 146 to facilitate fastening the electrostatic chuck 126 to the substrate support body 122.

A vacuum pump (not shown) exhausts gases from the process chamber through exhaust manifold 130 and maintains the total gas pressure in the chamber at a level low enough to facilitate creation of a plasma, for example in a range of about 10 millitorr to 20 torr, with pressures at the lower and higher ends of the range being more suitable for etching and CVD processes, respectively.

During processing of the substrate 110, a plasma is maintained in a region 148 of the semiconductor process chamber 100 defined between the substrate 110 and the anode electrode 108. The plasma is created by exciting a process gas mixture to a plasma state. The plasma may be generated within the process chamber (in situ plasma), or generated in another chamber (remote plasma source) and pumped into the process chamber.

A radio frequency (RF) power supply 132 is connected through one or more series coupling capacitors 134 to one or more of the following chamber components: the substrate support body 122, the chuck electrode 124, or an additional electrode (such as a wire mesh) embedded in the electrostatic chuck 126. Whichever of these components are connected to the RF power supply collectively constitute the cathode electrode of the process chamber. In one implementation, the substrate support body 122 is connected to the RF power supply 132 to function as the cathode electrode.

The RF power supply 132 provides an RF voltage between the cathode electrode and the grounded anode electrode 108, which helps supply the excitation power required to maintain the plasma. The RF voltage applied to the cathode also produces a time-average negative DC bias voltage on the cathode electrode relative to both the anode electrode and the plasma, which accelerates ionized process gas constituents toward the cathode electrode to facilitate processing of the substrate 110.

In an exemplary implementation, the substrate 110 supported by the substrate support assembly 120 may be a 200 mm, a 300 mm, or a 450 mm silicon wafer. A standard 200 mm substrate generally has a thickness of approximately 725 μm. A standard 300 mm substrate generally has a thickness of approximately 775 μm. A standard 450 mm substrate generally has a thickness of approximately 925 μm.

Universal Process Kit

Figure 2A:
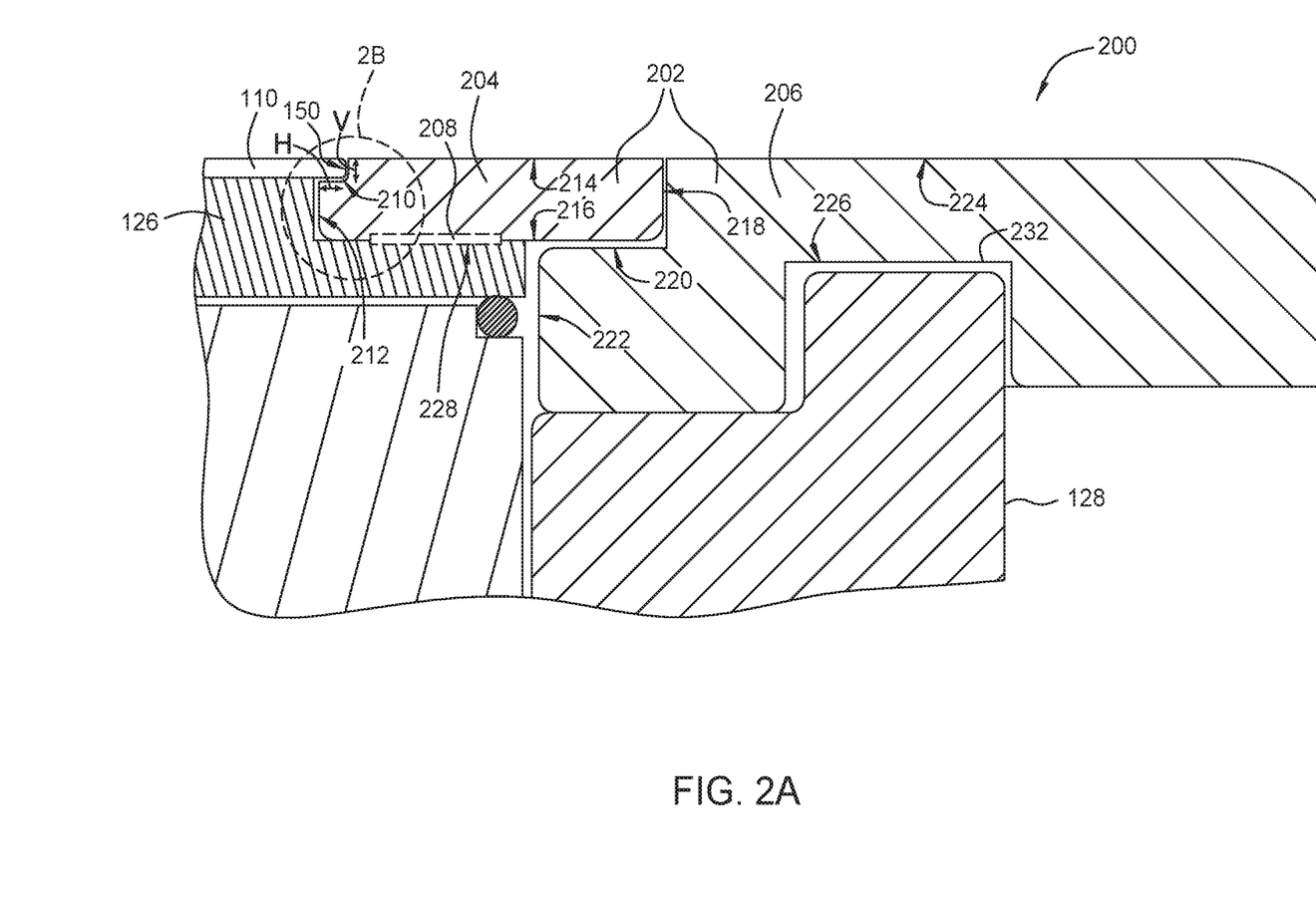
FIGS. 2A and 2B illustrate a schematic cross-sectional view and an enlarged schematic cross-sectional view of the process kit of FIG. 1, respectively.
Figure 3:
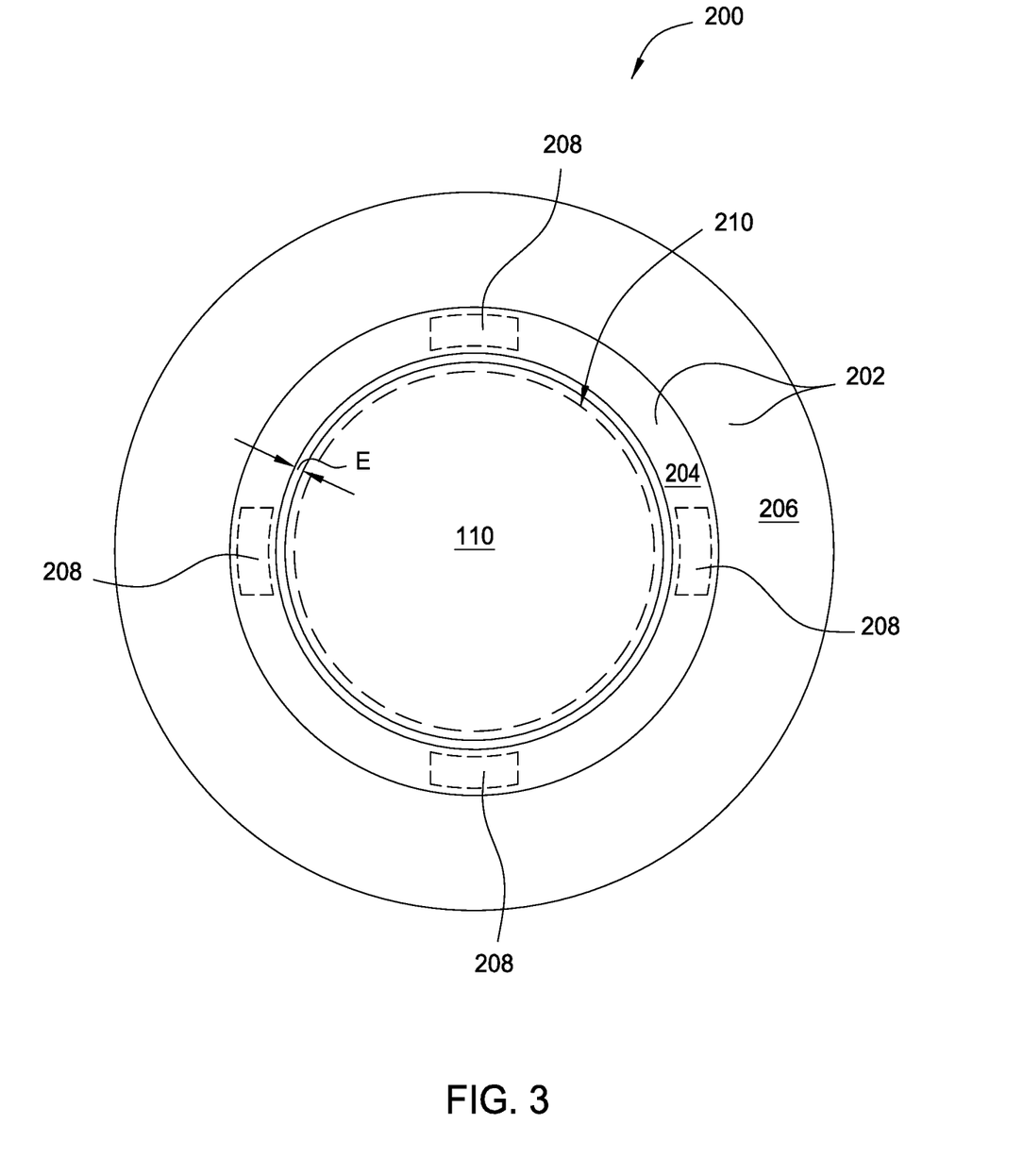
FIG. 3 illustrates a schematic top view of the process kit of FIG. 1.

FIG. 2A illustrates a schematic cross-sectional view of a process kit 200 suitable for use in the semiconductor process chamber 100 of FIG. 1. FIG. 3 illustrates a schematic top view of the process kit 200 of FIG. 1. Referring to both FIG. 2A and FIG. 3, the process kit 200 is disposed in the semiconductor process chamber 100 to improve plasma processing and to protect chamber components during processing. In some implementations, the process kit 200 may be coupled to and/or supported by the substrate support assembly 120 or may be used adjacent the substrate support assembly 120. The process kit 200 further extends around the perimeter of the substrate 110 and/or is disposed adjacent the substrate 110.

The process kit 200 includes an edge ring 202. The edge ring 202 includes an inner ring 204 and an outer ring 206. It is contemplated, however, that, in some implementations, the inner ring 204 and the outer ring 206 may form a single ring. The edge ring 202 encircles the perimeter 150 of the substrate support assembly 120. The edge ring 202 includes a notch 210 disposed along an inner diameter 212 of the edge ring 202 and/or inner ring 204.

The inner ring 204 is disposed adjacent the substrate support assembly 120. The inner ring 204 includes a first surface 214 and a second surface 216, wherein the second surface 216 is opposite the first surface 214. The inner ring 204 is fabricated from a non-metallic and/or a conductive material with a resistivity of less than about 100 Ohm-cm, for example, less than about 50 Ohm-cm. The inner ring 204 may be fabricated from a silicon carbide material, a silicon material, a non-metallic material, and/or mixtures and combinations thereof.

The inner ring 204 further includes a notch 210. In some implementations, the notch 210 is formed in the inner diameter 212 of the inner ring 204. The notch 210 includes a vertical component, as represented by reference arrow "V" in FIG. 2A. The vertical component V may have a rise of less than about 1500 μm, for example, less than about 1200 μm. The notch 210 further includes a horizontal component, as represented by reference arrow "H" in FIG. 2A. The horizontal component H may have a run that extends between about 1000 μm and about 3000 μm, for example, between about 1300 μm and about 2500 μm, such as about 1800 μm. The notch 210 may support the substrate 110 and/or prevent movement of the substrate 110 during processing.

Figure 2B:
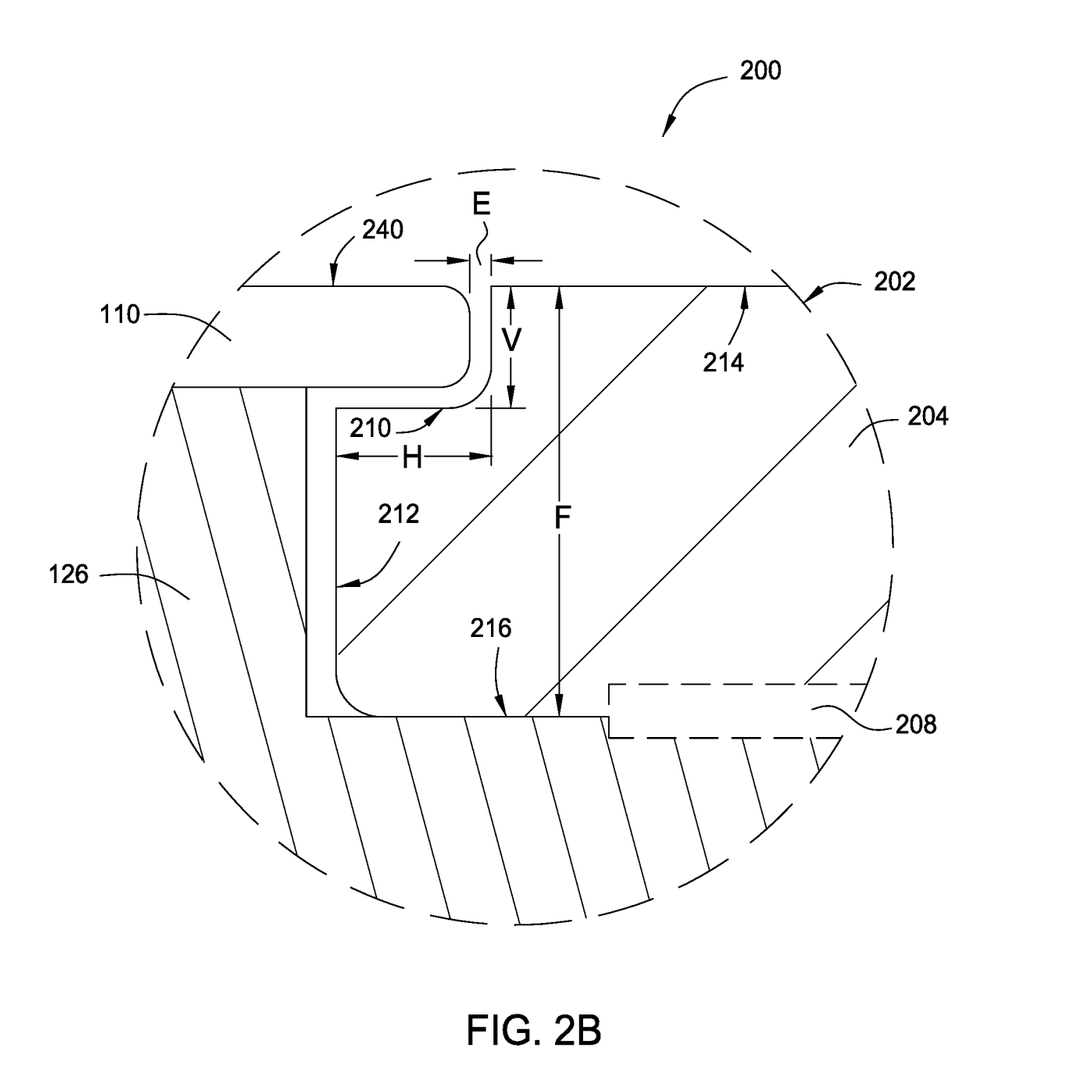

FIG. 2B is an enlarged sectional view of the notch 210 of the edge ring 202 illustrated FIG. 2A. In order to not perturb the plasma sheath at the edge of the substrate 110, the dimensions of the process kit 200 are precisely formed within close tolerances. As such, the dimension of the gap E between the substrate 110 and the inner ring 204 of the edge ring 202 is less than about 1000 μm, for example less than about 850 μm, such as less than about 800 μm. Furthermore, the height F of the inner ring 204 of the edge ring 202 is selected such that a top surface 240 of the substrate 110 and the first surface 214 of the inner ring 204 are approximately in the same plane. In some implementations, approximately in the same plane includes the vertical distance between the plane formed by the top surface 240 of the substrate 110 and the plane formed by the first surface 214 of the inner ring 204 are within about (+/−) 400 μm of each other, for example, within about (+1-) 300 μm of each other, such as within (+1-) 200 μm of each other.

Returning to FIGS. 2A and 3, the outer ring 206 is coupled to the inner ring 204, and may encircle an outer perimeter 218 of the inner ring 204. In some implementations, the outer ring 206 may support the inner ring 204 via a support ledge 220 formed along the inner perimeter 222 of the outer ring. Furthermore, the outer ring 206 includes a third surface 224 and a fourth surface 226. The third surface 224 may be opposite the fourth surface 226. The outer ring 206 may comprise a quartz material.

The process kit 200 may further include at least one thermal contact pad 208. In some implementations, the thermal contact pad 208 may be optional. Although only a portion of one thermal contact pad 208 is shown in FIG. 2A, it is contemplated that multiple thermal contact pads 208 may be utilized, as shown in FIG. 2B. The thermal contact pad 208 may be fabricated from a silicone (polymer) material. Furthermore, the thermal contact pad 208 and the edge ring 202 may each share a similar thermal conductivity. Benefits of the thermal contact pad 208 include the promotion of good thermal contact between the edge ring 202 and the electrostatic chuck 126.

The thermal contact pad 208 may be coupled to the inner ring 204. Each thermal contact pad 208 contacts the second surface 216 of the inner ring 204, and, in some implementations, each thermal contact pad 208 may have a non-continuous (i.e., segmented) ring shape, as shown in FIG. 3. As such, the thermal contact pad 208 may comprise a ring shape similar to that of the edge ring 202, however, the thermal contact may not extend fully around the edge ring 202. It is contemplated, however, that in some implementations one thermal contact pad 208, which is a continuous ring and has a continuous ring shape may extend fully around the edge ring 202. In other implementations, however, the thermal contact pad 208 may be of any suitable shape.

Furthermore, as shown in FIG. 3, a plurality of thermal contact pads 208 may contact the inner ring 204. As four thermal contact pads 208 are shown in FIG. 3, it is contemplated that any number of thermal contact pads 208 may be utilized. Each thermal contact pad 208 may promote good thermal contact between the edge ring 202 and the electrostatic chuck 126.

The second surface 216 of the inner ring 204 may include at least one slot 228 at least partially formed therein. Each slot 228 may houses a respective one of the thermal contact pads 208. As such, the number of thermal contact pads 208 and the number of slots 228 formed in the second surface 216 of the inner ring 204 may be the same. Each thermal contact pad 208 may be completely housed within each slot 228, however, in some implementations, each thermal contact pad 208 may extend partially out of the respective slot 228 as to project beyond the second surface 216 of the inner ring 204. Each slot 228 protects the respective thermal contact pad 208 and minimizes interference of the thermal contact pad 208 with other components.

In some implementations, the process kit 200 may further include a conductive member 230. The conductive member 230 may be coupled to the fourth surface 226 of the outer ring 206. In some implementations, the outer ring 206 may include a channel 232 formed in the fourth surface 226. The conductive member 230 may be at least partially disposed within the channel 232, such that the outer ring 206 is coupled to the conductive member 230.

Figure 4A:
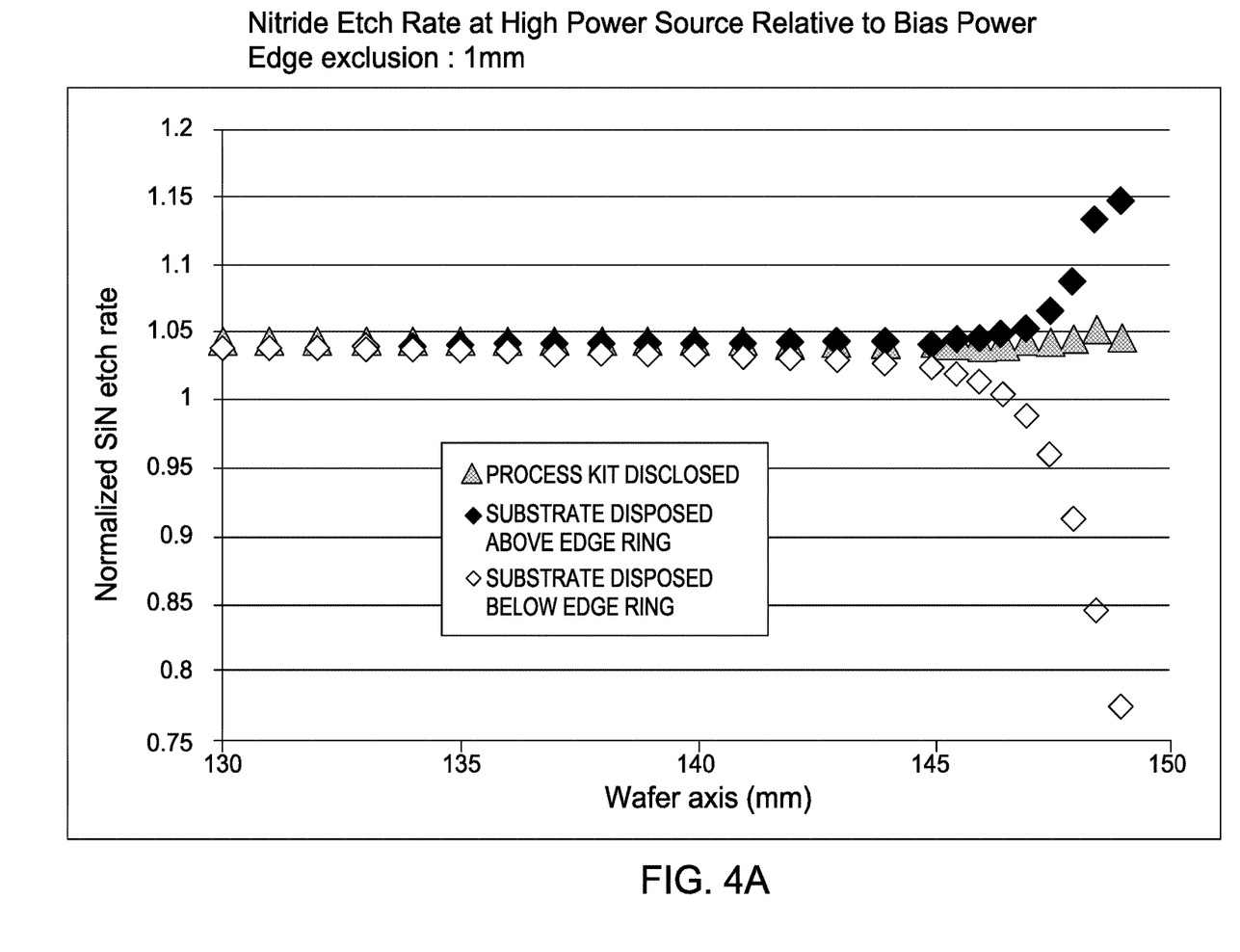
FIGS. 4A and 4B illustrate schematic graphs of a nitride etch rate performed with a high source power relative to bias power and a nitride etch rate performed with a low source power relative to bias power.
Figure 4B:
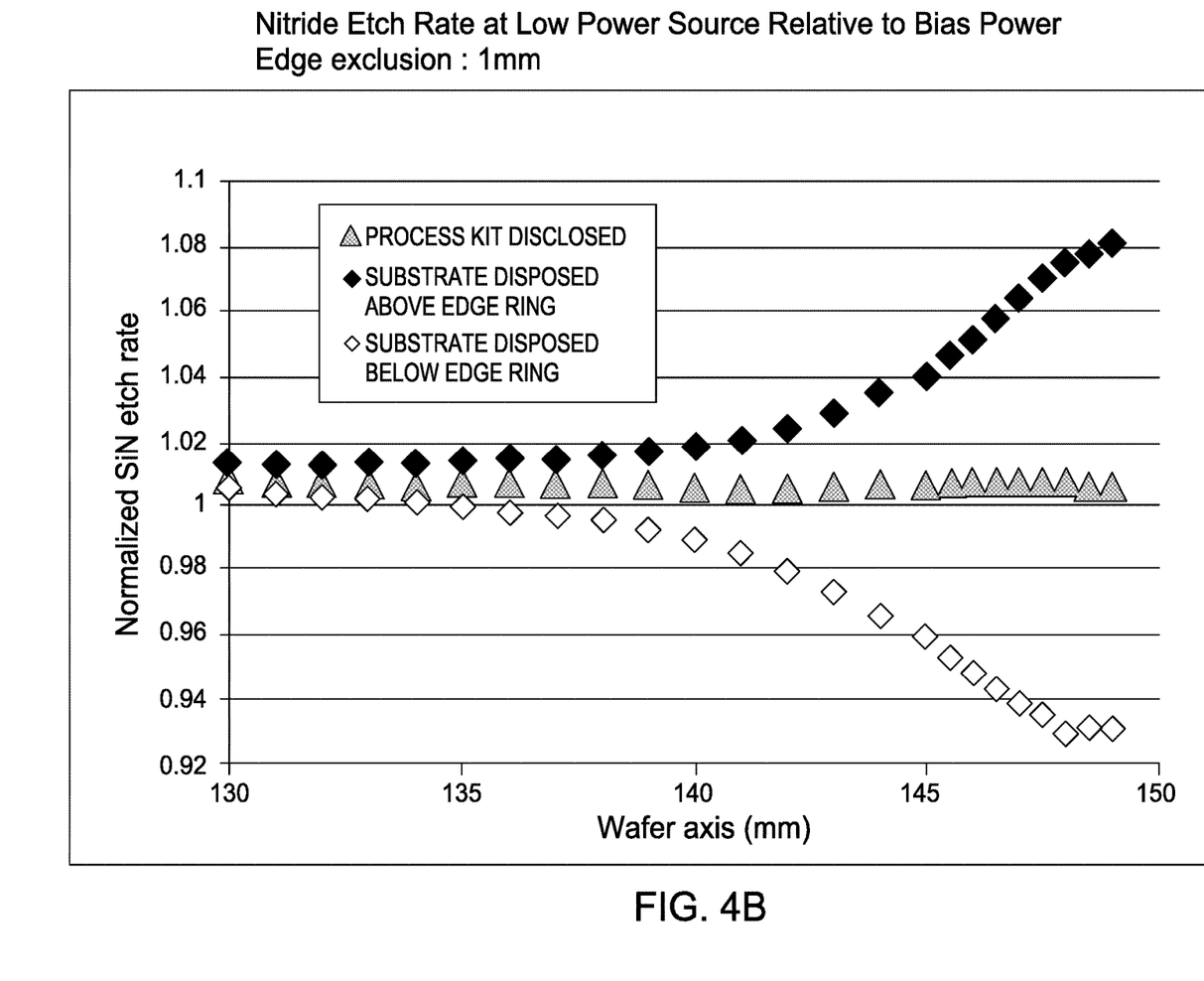

Testing was performed and results indicated that the ion focusing and defocusing effect is minimized with the use of the process kit disclosed herein, as shown in the schematic graphs of FIG. 4A and FIG. 4B. As further shown, the position of the surface of the substrate relative to the top surface of the ring is critical to minimize the perturbation of the plasma sheath at the edge of the substrate. If the edge ring is machined so that the substrate is above the plane of the edge ring, the plasma sheath may be bent outward. The ions move perpendicularly to the plasma sheath and are, therefore, deflected from the edge of the substrate which drives the etch rate down. On the other hand, if the edge ring is machined so that the substrate is below the plane of the ring the sheath may be bent inward thus focusing the ions on the edge of the wafer which drives the etch rate up. Utilization of the process kit disclosed herein positions the substrate in the same plane as the edge ring and, therefore, plasma sheath bending is minimized. Moreover, the ability of the plasma sheath to bend depends on the plasma sheath thickness and, therefore, on the plasma condition—mainly the source and bias power (compare Equation 1). FIG. 4A and FIG. 4B show that when the process kit of the present disclosure was tested with a high power source (e.g., above approximately 1000 Watts) relative to bias power (e.g., between about 50 Watts and about 500 Watts) or a low source power (e.g., below about 500 Watts) relative to bias power (e.g., between about 50 Watts and about 500 Watts), the process kit geometry minimized the edge effect regardless of the plasma conditions.

Benefits of the present disclosure include a process kit, which reduces perturbations of the plasma sheath at the edge of a substrate. The edge ring may include a conductive ring and a non-conductive ring, both of which may be machined to be flat with the substrate. As such, the process kit functions to reduce variations in plasma etching attributable to non-uniform plasma sheaths, thus improving the process uniformity.

In summation, implementations described herein generally relate to a process kit suitable for use in a semiconductor process chamber, which reduces edge effects and widens the processing window with a single edge ring as compared to conventional process kits. The process kit generally includes an edge ring disposed adjacent to and surrounding a perimeter of a semiconductor substrate in a plasma chamber. A dimension of a gap between the substrate and the edge ring is less than about 1000 µm, and a height difference between the substrate and the edge ring is less than about (+/−) 300 µm. The resistivity of the ring is less than about 50 Ohm-cm.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

What is claimed is:

1. A process kit suitable for use in a semiconductor process chamber, comprising:
    an edge ring, comprising:
        an inner ring, comprising:
            a non-metallic, conductive body having an inner diameter, an outer diameter, a first surface, and a second surface opposite the first surface, the second surface having at least one slot defined by an inner wall and an outer wall formed in the second surface of the non-metallic, conductive body, the non-metallic, conductive body having a resistivity of less than about 50 Ohm-cm, wherein the inner ring has a notch disposed along the inner diameter of the inner ring, wherein the notch has a vertical component that rises less than about 1200 µm and a horizontal component that extends between about 1300 µm and about 2500 µm; and
        an outer ring for coupling to the inner ring and encircling the outer diameter of the inner ring, the outer ring comprising:
            a quartz body having an inner perimeter, a third surface opposite a fourth surface, and a support ledge formed along the inner perimeter, wherein the support ledge supports the second surface of the inner ring and a diameter defined by the inner perimeter of the outer ring is greater than a diameter defined by the outer wall of the slot; and
        at least one thermal contact pad housed within the at least one slot, wherein the at least one thermal contact pad is positioned for contacting an electrostatic chuck, wherein the slot is horizontally disposed between the vertical component of the notch and the outer diameter of the conductive body.

2. The process kit of claim 1, wherein the inner ring comprises a silicon carbide material, a silicon material, a non-metallic material, or a combination thereof.

3. The process kit of claim 1, wherein the thermal contact pad and the edge ring share a similar thermal conductivity.

4. The process kit of claim 1, wherein the at least one thermal contact pad has a non-continuous ring shape.

5. The process kit of claim 1, wherein the thermal contact pad comprises a silicone material.

6. The process kit of claim 1, further comprising a conductive member coupled to the fourth surface of the outer ring.

7. The process kit of claim 6, wherein the outer ring has a channel formed in the fourth surface, and wherein the conductive member is at least partially disposed within the channel.

8. A plasma chamber for performing a semiconductor process on a substrate, comprising:
    a substrate support assembly; and
    a process kit suitable for use adjacent the substrate support assembly and coupled to a flange of the substrate support assembly, comprising:
        an edge ring comprising:
            an inner ring disposed adjacent the substrate support assembly and comprising:
                a non-metallic, conductive body having an inner diameter, an outer diameter, a first surface, a second surface opposite the first surface, the second surface having at least one slot defined by an inner wall and an outer wall formed in the second surface of the non-metallic, conductive body, wherein the inner ring has a notch disposed along the inner diameter of the inner ring, wherein the notch has a vertical component that rises less than about 1200 µm and a horizontal component that extends between about 1300 µm and about 2500 µm; and
            an outer ring for coupling to the inner ring and encircling the outer diameter of the inner ring, comprising:
                a quartz body having an inner perimeter, a third surface opposite a fourth surface, and a support ledge formed along the inner perimeter, wherein the support ledge supports the second surface of the inner ring and a diameter defined by the inner perimeter of the outer ring is greater than a diameter defined by the outer wall of the slot;
a conductive member coupled to the outer ring; and
at least one thermal contact pad coupled to the inner ring and disposed within the slot, wherein the at least one thermal contact pad is positioned for contacting the substrate support assembly, and the slot is horizontally disposed between the vertical component of the notch and the outer diameter of the conductive body.

9. The plasma chamber claim 8, wherein the inner ring has a resistivity of less than about 50 Ohm-cm.

10. The plasma chamber of claim 8, wherein the inner ring comprises a silicon carbide material, a silicon material, or a combination thereof.

11. The plasma chamber of claim 8, wherein the at least one thermal contact pad comprises a silicone material.

12. The plasma chamber of claim 8, wherein the conductive member is at least partially disposed in a channel formed in the outer ring.

13. The plasma chamber of claim 8, further comprising a second thermal contact pad, a third thermal contact pad, and a fourth thermal contact pad, wherein each thermal contact pad is disposed in a slot formed in the inner ring.

14. A process kit suitable for use in a process chamber, comprising:
an edge ring encircling a perimeter of a substrate support assembly disposed in the process chamber, the edge ring comprising:
an inner ring disposed adjacent the substrate support assembly, comprising:
a non-metallic, conductive material and having an inner diameter, an outer diameter, a first surface, and a second surface opposite the first surface, the second surface having at least one slot defined by an inner wall and an outer wall formed in the second surface of the non-metallic, conductive body, wherein the inner ring has a notch disposed along the inner diameter of the inner ring, wherein the notch has a vertical component that rises less than about 1200 µm and a horizontal component that extends between about 1300 µm and about 2500 µm; and
an outer ring coupled to the inner ring and encircling the outer diameter of the inner ring, wherein the outer ring comprising:
a quartz body having an inner perimeter, a third surface opposite a fourth surface, and a support ledge formed along the inner perimeter, wherein the support ledge supports the second surface of the inner ring and a diameter defined by the inner perimeter of the outer ring is greater than a diameter defined by the outer wall of the slot;
at least one thermal contact pad coupled to the inner ring and disposed within the slot formed in the inner ring, wherein the slot is horizontally disposed between the vertical component of the notch and the outer diameter of the conductive body; and
a conductive member coupled to the outer ring.

15. The process kit of claim 14, wherein the inner ring comprises a silicon carbide material, a silicon material, a non-metallic material, or a combination thereof.

16. The process kit of claim 14, wherein the at least one thermal contact pad comprises a silicone material.

17. The process kit of claim 1, wherein the vertical component defines a diameter that is less than a diameter defined by the inner wall of the slot.

18. The plasma chamber of claim 8, wherein the vertical component defines a diameter that is less than a diameter defined by the inner wall of the slot.

19. The process kit of claim 14, wherein the vertical component defines a diameter that is less than a diameter defined by the inner wall of the slot.

20. The process kit of claim 14, wherein the conductive member is at least partially disposed in a channel formed in the outer ring.

* * * * *